US012341539B2

(12) United States Patent
Li et al.

(10) Patent No.: US 12,341,539 B2
(45) Date of Patent: Jun. 24, 2025

(54) DATA COMPRESSION AND DECOMPRESSION METHODS AND SYSTEMS

(71) Applicant: MONTAGE TECHNOLOGY CO., LTD., Shanghai (CN)

(72) Inventors: Xiaoyan Li, Shanghai (CN); Zhaohui Du, Shanghai (CN); Men Long, Shanghai (CN); Yang Chao, Shanghai (CN); Dajiang Zhong, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 216 days.

(21) Appl. No.: 18/224,199

(22) Filed: Jul. 20, 2023

(65) Prior Publication Data
US 2024/0030937 A1  Jan. 25, 2024

(30) Foreign Application Priority Data
Jul. 21, 2022  (CN) .......................... 202210869093.6

(51) Int. Cl.
*H03M 7/00* (2006.01)
*G06F 11/10* (2006.01)
*H03M 7/30* (2006.01)

(52) U.S. Cl.
CPC ....... *H03M 7/6041* (2013.01); *G06F 11/1044* (2013.01)

(58) Field of Classification Search
CPC ............. H03M 7/6041; H03M 7/6064; H03M 7/6082; H03M 7/607; G06F 11/1014; G06F 11/14; G06F 11/076
USPC ...................................................... 341/50, 51
See application file for complete search history.

(56) References Cited

U.S. PATENT DOCUMENTS

| 7,460,032 B2* | 12/2008 | Boldt ..................... H03M 7/30 |
| | | 341/51 |
| 2017/0153844 A1* | 6/2017 | Kwon ..................... G06F 3/061 |
| 2020/0265137 A1* | 8/2020 | Yoon .................... G06F 11/1068 |

* cited by examiner

*Primary Examiner* — Peguy Jean Pierre
(74) *Attorney, Agent, or Firm* — Oliff PLC

(57) ABSTRACT

A data compression method includes: storing data to be written into a first address and a second address into a data buffer in response to a data write request to the first address and the second address of a memory module from a host; according to a relationship between the first address and the second address, selecting a compression scheme from pre-configured compression schemes, and attempting to compress the data to be written into the first address and the second address into compressed data that can be stored into either the first address or the second address by using a pre-defined compression method, if the attempt to compress successes, storing the compressed data into the first address or the second address of the memory module, and identifying the compressed data by using redundant ECC bits to form first identification information.

20 Claims, 3 Drawing Sheets

200

202
Store data to be written into a first address and a second address into a data buffer in response to a data write request to the first address and the second address of a memory module from a host 204
According to a relationship between the first address and the second address, select a compression scheme from pre-configured compression schemes, and attempt to compress the data to be written into the first address and the second address into compressed data that can be stored into either the first address or the second address by using a pre-defined compression method, if the attempt to compress successes, store the compressed data into the first address or the second address, and identify the compressed data by using redundant ECC bits to form first identification information

DATA COMPRESSION AND DECOMPRESSION METHODS AND SYSTEMS

CROSS-REFERENCE TO PRIOR APPLICATION

This application claims priority to Chinese Application number CN2022108690936 which is filed on Jul. 21, 2022, the contents of which are incorporated herein by reference.

TECHNICAL FIELD

The application relates to the technical field of memory, in particular to data compression and decompression methods and systems.

BACKGROUND

At present, a known memory side channel attack method is to establish a covert channel by exploiting access conflict of a row buffer of the memory.

FIG. 1 shows a diagram of the side channel attack. A sender and a receiver can establish a covert channel via the host side through the row buffer of the memory. For example, the receiver of a hacker (a software program running on a virtual machine in a physical machine) continuously accesses address A and measures the access time; the sender of a hacker (a software program running on another virtual machine of the same physical machine) reads/writes different row address B in the same memory bank as address A, which requires page closing and page opening operations, resulting in row access conflict. In the receiver's next access to the address A, this row access conflict will increase the latency of data access. By using this difference of latency measured by the receiver, a covert-channel can be established, which makes it possible to transmit some illegal information.

SUMMARY OF THE INVENTION

An object of the present application is to provide data compression and decompression methods and systems, which can defend against side-channel attacks caused by the row access conflicts and can improve memory bandwidth at the same time.

The application discloses a data compression method, which is applied to a memory controller, the method comprises:
  storing data to be written into a first address and a second address into a data buffer in response to a data write request to the first address and the second address of a memory module from a host; wherein, the first address and the second address are located in the same memory bank of the memory module;
  according to a relationship between the first address and the second address, selecting a compression scheme from pre-configured compression schemes, and attempting to compress the data to be written into the first address and the second address into compressed data that can be stored into either the first address or the second address by using a pre-defined compression method, if the attempt to compress successes, storing the compressed data into the first address or the second address, and identifying the compressed data by using redundant ECC bits to form first identification information.

In one embodiment, the first identification information includes an identification for indicating that the data is compressed, the relationship between the first address and the second address, and the compression method used.

In one embodiment, the relationship between the first address and the second address comprises: the first address and the second address being located in adjacent rows of the same memory bank, and the first address and the second address being located in non-adjacent rows of the same memory bank.

In one embodiment, if the first address and the second address are located in non-adjacent rows of the same memory bank, the first identification information further includes row address information of the first address or the second address where the compressed data is not stored into.

In one embodiment, the pre-configured compression schemes include:
  a scheme for compressing data of two adjacent addresses in the same memory bank, and a scheme for compressing data of two non-adjacent addresses in the same memory bank.

In one embodiment, the method further includes:
  if the attempt to compress fails, storing the data to be written into the first address and the second address into the first address and the second address, respectively, and identifying the data stored into the first address and the data stored into the second address respectively by using respective redundant ECC bits to form second identification information.

In one embodiment, the second identification information includes an identification for indicating that data is not compressed.

This application also disclosed a data decompression method, which is applied to a memory controller, the method comprises:
  reading data from a first address or a second address of the memory module in response to a read request for data of the first address or the second address from a host;
  if first identification information is identified according to redundant ECC bit identification in the first address or the second address, decompressing the data read from the first address or the second address according to the first identification information to obtain a decompressed data of the first address and the second address;
  storing the decompressed data of the first address and the second address into a data buffer, and returning the data of corresponding address to the host according to the read request from the host.

In one embodiment, after storing the decompressed data into the data buffer, the method further comprises:
  in response to the read request for data of the first address or the second address from the host;
  retrieving and sending the data of the first address or the second address from the data buffer to the host.

In one embodiment, if second identification information is identified according to redundant ECC bit identification in the first address or the second address, returning the data read from the first address or the second address to the host.

This application also disclosed a data compression system comprising a memory module and a memory controller, wherein the memory controller comprises:
  a receiving module, configured to store data to be written into a first address and a second address into a data buffer in response to a data write request to the first address and the second address of a memory module from a host; wherein, the first address and the second address are located in the same memory bank of the memory module;

a compression processing logic module, configured to select a compression scheme from pre-configured compression schemes according to a relationship between the first address and the second address, and attempt to compress the data to be written into the first address and the second address into compressed data that can be stored into either the first address or the second address by using a pre-defined compression method, if the attempt to compress successes, store the compressed data into the first address or the second address, and identify the compressed data by using redundant ECC bits to form first identification information.

In one embodiment, if the first address and the second address are located in non-adjacent rows of the same memory bank, the first identification information further includes row address information of the first address or the second address where the compressed data is not stored into.

This application also disclosed a data decompression system comprising a memory module and a memory controller, wherein the memory controller comprises:

a receiving module, configured to read data from a first address or a second address of the memory module in response to a read request for data of the first address or the second address from a host;

a decompression processing logic module, configured to decompressing the data read from the first address or the second address according to the first identification information to obtain a decompressed data of the first address and the second address, if first identification information is identified according to redundant ECC bit identification in the first address or the second address;

a sending module, configured to store the decompressed data of the first address and the second address into a data buffer, and return the data of corresponding address to the host according to the read request from the host.

In one embodiment, the sending module is further configured to retrieve and send the data of the first address or the second address from the data buffer to the host in response to the read request for the data of the first address or the second address from the host after storing the decompressed data into the data buffer.

In one embodiment, the decompression processing logic module is further configured to notify the sending module to return the data read from the first address or the second address to the host if second identification information is identified according to redundant ECC bit identification in the first address or the second address.

Embodiments of this application, for the data write request to the first address and second address located in the same storage bank, the memory controller attempts to compress the data to be written into the first and second addresses, and stores the compressed data into either the first address or the second address, which can double the data bandwidth of the memory module. Furthermore, upon receiving a data read request to the first address or the second address located in the same memory bank, if the data stored in the first address or the second address is identified as compressed data, a decompressing processing may be performed to it and the decompressed data will be stored into the data buffer, which makes it possible for the data stored in the first address or the second address to already exist in the data buffer when the hacker accesses the first address or the second address, thus avoiding duplicate accesses to the memory module and reducing the probability of opening and closing the memory module pages, which in turn can avoid the row access conflict that the hacker expects and mitigate the side-channel attacks.

A large number of technical features are described in the specification of the present application, and are distributed in various technical solutions. If a combination (i.e., a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute Various new technical solutions (all of which are considered to have been described in this specification), unless a combination of such technical features is not technically feasible. For example, feature A+B+C is disclosed in one example, and feature A+B+D+E is disclosed in another example, while features C and D are equivalent technical means that perform the same function, and technically only choose one, not to adopt at the same time. Feature E can be combined with feature C technically. Then, the A+B+C+D scheme should not be regarded as already recorded because of the technical infeasibility, and A+B+C+E scheme should be considered as already documented.

DETAILED DESCRIPTION

In the following description, numerous technical details are set forth in order to provide the readers with a better understanding of the present application. However, those skilled in the art can understand that the technical solutions claimed in the present application can be implemented without these technical details and various changes and modifications based on the following embodiments.

In order to make the objects, technical solutions and advantages of the present application more clear, embodiments of the present application will be further described in detail below with reference to the accompanying drawings.

Figure 1:
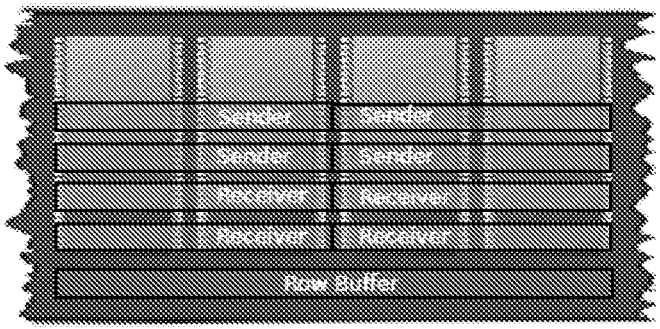
FIG. 1 is a schematic diagram of an example of side-channel attack.
Figure 2:
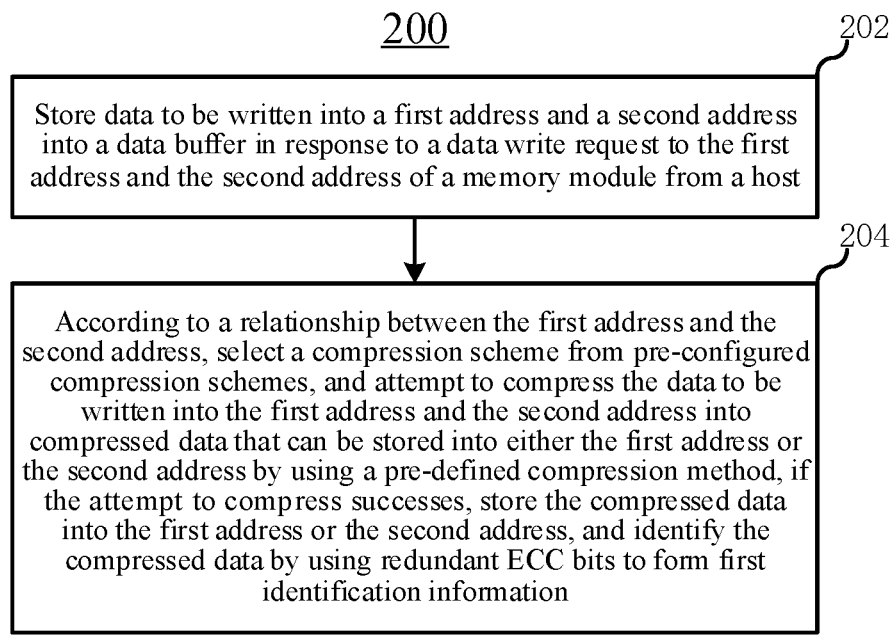
FIG. 2 is a flow diagram of a data compression method according to a first embodiment of the present application.

FIG. 2 is a flow diagram of a data compression method 200 according to a first embodiment of the present application, which is applied to the memory controller. The method 200 includes:

Step 202, in response to a data write request to a first address and a second address of a memory module from a host, the memory controller stores the data to be written into the first address and the second address into a data buffer. Wherein the first address and the second address are located in the same memory bank of the memory module.

Step 204, according to a relationship between the first address and the second address, selecting a compression scheme from pre-configured compression schemes, and attempting to compress the data to be written into the first address and the second address into compressed data that can be stored into either the first address or the second address by using a pre-defined compression method, if the attempt to compress successes, storing the compressed data into the first address or the second address of the memory module, and identifying the compressed data by using redundant ECC bits to form first identification information.

Specifically, when the memory controller receives a data write request from the host to the first address and the second address of the memory module (the first address and the second address are located in the same memory bank), it firstly stores the data to be written into the first address and the second address into the data buffer, and then selects a compression scheme from the pre-configured compression schemes based on the relationship between the first address and the second address.

In one embodiment, the relationship between the first address and the second address comprises: the first address and the second address being located in adjacent rows of the same memory bank, and the first address and the second address being located in non-adjacent rows of the same memory bank. If the first address and the second address are located in adjacent rows of the same memory bank, the memory controller may select from the pre-configured compression schemes a scheme for compressing the data of the two adjacent addresses in the same memory bank, and if the first address and the second address are located in non-adjacent rows of the same memory bank, the memory controller may select from the pre-configured compression schemes a scheme for compressing the data of the two non-adjacent addresses in the same memory bank. The compression schemes are, for example, but not limited to, configured via registers.

After the compression scheme is determined, the memory controller may attempt to compress the data to be written into the first address and the second address by using a pre-defined compression method so that the compressed data can be stored into one of the first and second addresses. The pre-defined compression method may include one or more compression methods capable of compressing data of two addresses into data of one address. For example, a compression method based on the sparsity of "1" in the data, i.e., a method that counts the positions of "1" in the data to be compressed and compresses the data based on the result. As an example, the data to be compressed is 512 bits, firstly, counting the positions of "1" in the 512-bit data, the total number of positions of "1" is at most 511, and then the positions of "1" in the 512-bit data may be described by using 9 bits. Assuming that the number of "1" in the 512-bit data is less than 29, it can be found that using 28 positions, each containing 9 bits, can describe the 512-bit data. Thus, the 512-bit data can be compressed to 252 (28×9) bits. For a better understanding, giving a specific example: assuming that the 512-bit data contains five "1" (located at the 3th, 7th, 12th, 13th, and 56th bits), and the rest bits are all 0. Using the above method, the results of the compressed data are as follows: Bit[8:0]=3; Bit[17:9]=7; Bit[26:18]=12; Bit[35:27]=13; Bit[44:36]=56; Bit[255:45]=0. This compression method is very efficient and can be implemented in the memory controller with almost no time consuming, which helps to maintain or improve the access performance of the memory module. In addition, it is also possible to use identifiers for variable-length data compression. Examples of two-bit identifiers and their corresponding data patterns and encoding methods are listed in Table 1 below. It can be understood that the details listed in Table 1 are primarily for ease of understanding and do not serve as a limitation on the scope of protection of this application. It can be understood that although this application has proposed the above two compression methods, this application is not limited to this. Any one or more compression methods capable of compressing data of two addresses into data of one address may be used as the compression method in this application.

TABLE 1 correspondence table between two-bit identifiers, data patterns and encoding methods

| Identifier | Pattern | Encoding method |
|---|---|---|
| 00 | 32-bit of zeros | 00 |
| 01 | 8-bit MSB is zero | 0101 ‖ 3_byte |
| 01 | 16-bit MSB is zero | 0110 ‖ 2_byte |
| 01 | 24-bit MSB is zero | 0111 ‖ 1_byte |
| 10 | 8-bit MSB is FF | 1001 ‖ 3_byte |
| 10 | 16-bit MSB is FF | 1010 ‖ 2_byte |
| 10 | 24-bit MSB is FF | 1011 ‖ 1_byte |
| 11 | 32-bit of ones | 11 |

According to the different compression results, the memory controller may take different processing methods as follows.

If the attempt to compress successes, the memory controller stores the compressed data into the first address or the second address, and identifies the compressed data by using redundant ECC bits to form the first identification information. Taking the compression data being stored into the first address as an example, the memory controller may identify the compressed data stored into the first address using redundant ECC bits to form the first identification information.

In one embodiment, the first identification information may include an identification for indicating that the data is compressed, the relationship between the first address and the second address, and the compression method used. In another embodiment, if the first address and the second address are located in non-adjacent rows of the same memory bank, the first identification information may further include row address information of the first address or the second address where the compressed data is not stored into. Still taking the compression data being stored into the first address as an example, the first identification information may also include the row address information of the second address.

If the attempt to compress fails, the memory controller stores the data to be written into the first address and the second address to the first address and the second address of the memory module, respectively, and identifies the data stored into the first address and the data stored into the second address respectively by using respective redundant ECC bits to form second identification information. Wherein the second identification information may include an identification for indicating that data is not compressed.

In addition, the memory module described in this application may be any type of memory containing redundant ECC bits, such as but not limited to DDR5 memory. It can be understood that different ECC schemes have different numbers of redundant ECC bits. For example, when using the SECDED ECC scheme, there may be 16 redundant ECC bits; when using Reed-Solomon (144*b*, 128*b*) scheme, there may be 64 redundant ECC bits. Therefore, the identification information with different bit lengths can be set depending on the different numbers of redundant ECC bits. Table 2 below is an example scheme using 512-bit redundant ECC bits of DDR5 memory to identify the stored data. It can be understood that the details listed in Table 2 are primarily for ease of understanding and do not serve as a limitation on the scope of protection of this application.

TABLE 2 example scheme using 512-bit redundant ECC bits to identify the stored data

| | |
|---|---|
| Bit 0 | "0" indicates that this row includes no compression of data (for indicating that the data is not compressed); "1" indicates that this row includes the compression of two 512-bit data (for indicating that the data is compressed). |
| Bit 1 | "0" indicates that the other row is an adjacent row address in the same memory bank; "1" indicates that the other row is not an adjacent row address in the same memory bank (the relationship between the first address and the second address). |
| Bits 4-2 | The compression method used. |
| Bits 21-5 | If Bit 1 is "1", the row address is placed in the redundant ECC bits [21:5] (the first address and the second address are non-adjacent rows of the same memory bank, the row address information of the first address or the second address where the compressed data is not stored into is placed in the redundant ECC bits [21:5]). |

Figure 3:
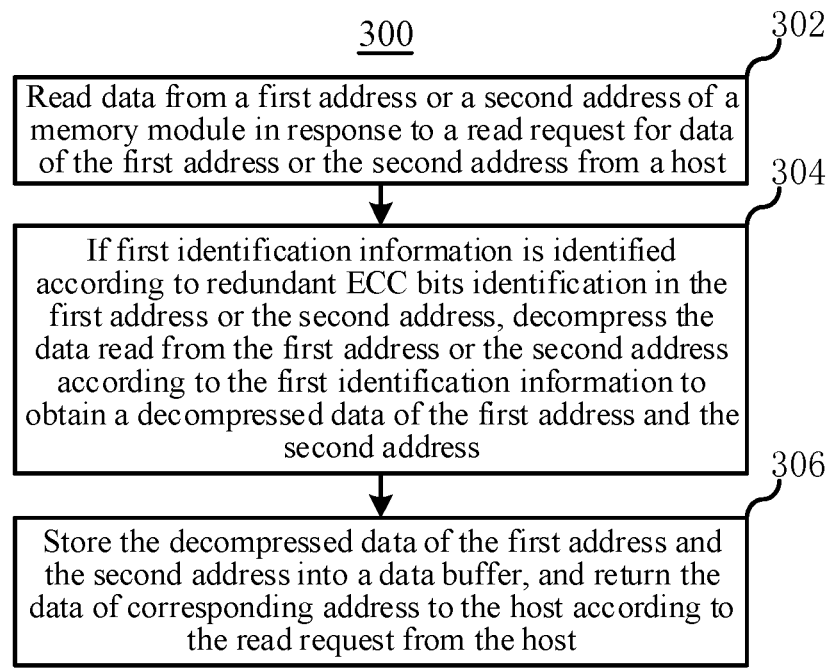
FIG. 3 is a flow diagram of a data decompression method according to a second embodiment of the present application.

FIG. 3 is a flow diagram of a data decompression method 300 according to a second embodiment of the present application, which is applied to the memory controller. The method 300 is a corresponding decompression method corresponding to the data compression method 200 of the first embodiment. The method 300 includes:

Step 302, reading data from the first address or the second address of the memory module in response to a read request for data of the first address or the second address from a host;

Step 304, if the first identification information is identified according to redundant ECC bit identification in the first address or the second address, decompressing the data stored at the first address or the second address according to the first identification information to obtain a decompressed data of the first address and the second address.

Step 306, storing the decompressed data of the first address and the second address into a data buffer, and returning the data of corresponding address to the host according to the read request from the host.

Specifically, when the memory controller receives a data read request from the host to the first address or the second address of the memory module (the first address and the second address are located in the same memory bank), it reads the data from the first address or the second address and takes different processing methods depending on the information identified by the redundant ECC bits in the first address or the second address. The following will take the host to access the first address of the memory module as an example for specific description.

When the memory controller receives the data read request from the host to the first address of the memory module, it reads the data stored at the first address and determines the information identified by the redundant ECC bits in the first address.

If the redundant ECC bits identify the first identification information, it indicates that the data stored in the first address is the data of the first address and second address that is compressed. At this time, the memory controller can decompress the read data based on the first identification information to obtain the decompressed data of the first address and the second address. The memory controller may store the decompressed data of the first address and the second address into the data buffer, and at the same time send the decompressed data of the first address to the host.

After the memory controller stores the compressed data of first address data and the second address into the data buffer, if a next read request is received from the host for the data of the first or second address, the data of the first or second address can be obtained directly from the data buffer and sent to the host, avoiding duplicate accesses to the memory module and reducing the probability of opening and closing the memory module pages, which in turn can avoid the row access conflicts that the hacker expects and mitigate the side-channel attacks.

In one embodiment, the first identification information may include an identification for indicating that the data is compressed, the relationship between the first address and the second address, and the compression method used. In another embodiment, if the first address and the second address are located in non-adjacent rows of the same memory bank, the first identification information may further include row address information of the first address or the second address where the compressed data is not stored into. Still taking the compression data being stored into the first address as an example, the first identification information can also include the row address information of the second address.

If the redundant ECC bits identify the second identification information, it indicates that the data stored in the first address isn't compressed. At this time, the memory controller can directly send the data read from the first address to the host. In one embodiment, the second identification information includes an identification for indicating that data isn't compressed.

Figure 4:
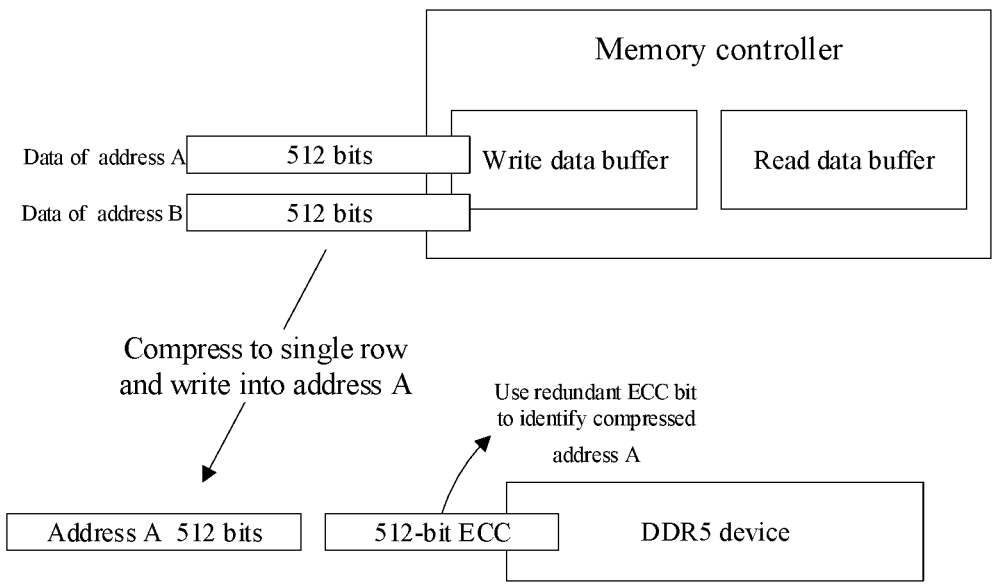
FIG. 4 is a diagram of a data compression process according to an example of the present application.
Figure 5:
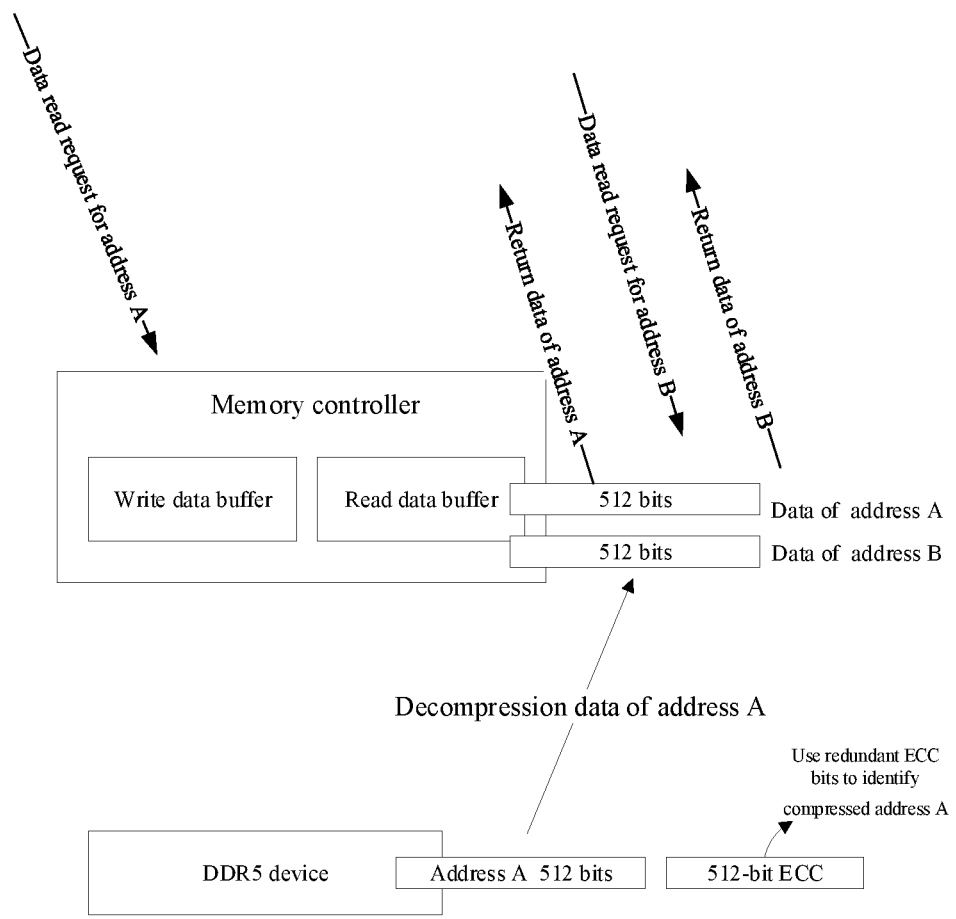
FIG. 5 is a diagram of a data decompression process according to an example of the present application.

In order to better understand the first and second embodiments of this application and their beneficial effects, the following description will be given with a specific example of data compression and decompression process of DDR5 device. The details listed in this embodiment are mainly for ease of understanding and are not intended to limit the scope of protection of this application. In this example, the memory controller is pre-configured with compression schemes through the registers, that is, the compression scheme of adjacent or non-adjacent rows in the same memory bank. As shown in FIG. 4, when receiving a data write request, the memory controller firstly stores 512-bit data to be written into the address A and 512-bit data to be written into address B into a write data buffer (located in the data buffer). The address A and the address B are located in adjacent or non-adjacent rows in the same memory bank. The memory controller attempts to compress the two rows of data from 1024 bits to 512 bits. If the compression successes, the compressed 512-bit data is written into address A of the DDR5 (or address B, FIG. 4 illustrates the example of writing into address A) and identified by using redundant ECC bits to form the first identification information. Correspondingly, as shown in FIG. 5, when the memory controller receives a read request to address A, it reads the data stored in the address A. If the memory controller identifies the first identification information of the redundant ECC identification, the data read from the address A is decompressed to obtain the decompressed data of the address A and the decompressed data of the address B. The memory controller stores the decompressed data of the address A and the address B in a read data buffer (located in the data buffer) and returns the data of the address A to the request party. Since then, if the memory controller receives a read request to address A or address B, the data of the address A or address B can be directly returned from the read data buffer without access to DDR5. From this example, it can be seen that, compared to the prior art where 32 DDR5 clock cycles are required to return 1024 bits of data, this application only requires 16 DDR5 clock cycles to obtain 1024 bits data under successful compression, which can double the read data performance of DDR5. At the same time, due to the presence of decompression, for the read data buffer that supports pre-read operations can reduce the probability of DDR5 page opening and closing, which can also mitigate DDR5 side-channel attacks caused by the row buffer conflicts.

A third embodiment of this application discloses a data compression system that includes the memory module and the memory controller including a receiving module and a compressed processing logic module. Wherein, the receiving module is configured to store data to be written into a first address and a second address into a data buffer in response to a data write request to the first address and the second address of the memory module from a host. Wherein, the first address and the second address are located in the same memory bank of the memory module.

The compression processing logic module is configured to select a compression scheme from pre-configured compression schemes according to a relationship between the first address and the second address, and attempt to compress the data to be written into the first address and the second address into compressed data that can be stored into either the first address or the second address by using a pre-defined compression method, if the attempt to compress successes, store the compressed data into the first address or the second address of the memory module, and identify the compressed data by using redundant ECC bits to form first identification information.

In one embodiment, the pre-configured compression schemes include a scheme for compressing data of two adjacent addresses in the same memory bank, and a scheme for compressing data of two non-adjacent addresses in the same memory bank.

In one embodiment, the first identification information may include an identification for indicating that the data is compressed, the relationship between the first address and the second address, and the compression method used. The relationship between the first address and the second address includes: the first address and the second address being located in adjacent rows of the same memory bank, and the first address and the second address being located in non-adjacent rows of the same memory bank. If the first address and the second address are located in non-adjacent rows of the same memory bank, the first identification information may further include row address information of the first address or the second address where the compressed data is not stored into.

In some embodiments, if the attempt to compress fails, the compression processing logic module is further configured to store the data to be written into the first address and the second address, respectively, and identify the data stored into the first address and the data stored into the second address respectively by using respective redundant ECC bits to form second identification information. Wherein the second identification information includes an identification for indicating that data is not compressed.

It will be understood that the first embodiment is a method embodiment corresponding to the present embodiment, and the technical details in the first embodiment can be applied to the present embodiment, and the technical details in the present embodiment can also be applied to the first embodiment.

A fourth embodiment of this application discloses a data decompression system that includes the memory module and the memory controller including a receiving module, a decompressed processing logic module, and a sending module.

The receiving module is configured to read data from a first address or a second address of the memory module in response to a read request for data of the first address or the second address from a host.

The decompression processing logic module is configured to decompressing the data read from the first address or the second address according to the first identification information to obtain a decompressed data of the first address and the second address, if first identification information is identified according to redundant ECC bit identification in the first address or the second address.

The sending module is configured to store the decompressed data of the first address and the second address into a data buffer, and return the data of corresponding address to the host according to the read request from the host.

In one embodiment, the first identification information may include an identification for indicating that the data is compressed, the relationship between the first address and the second address, and the compression method used. The relationship between the first address and the second address includes: the first address and the second address being located in adjacent rows of the same memory bank, and the first address and the second address being located in non-adjacent rows of the same memory bank. If the first address and the second address are located in non-adjacent rows of the same memory bank, the first identification information may further include row address information of the first address or the second address where the compressed data is not stored into. And, in some embodiments, the decompression processing logic module is further configured to notify the sending module to return the data read from the first address or the second address to the host if second identification information is identified according to redundant ECC bit identification in the first address or the second address. Wherein the second identification information may include an identification for indicating that data is not compressed.

In one embodiment, the sending module is further configured to retrieve and send the data of the first address or the second address from the data buffer to the host in response to the read request for the data of the first address or the second address from the host, after storing the decompressed data into the data buffer.

It will be understood that the second embodiment is a method embodiment corresponding to the present embodiment, and the technical details in the second embodiment can be applied to the present embodiment, and the technical details in the present embodiment can also be applied to the second embodiment.

It should be noted that in this specification of the application, relational terms such as the first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a multiple elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In this specification of the application, if it is mentioned that an action is performed according to an element, it means the meaning of performing the action at least according to the element, and includes two cases: the action is performed only on the basis of the element, and the action is performed based on the element and other elements. Multiple, repeatedly, various, etc., expressions include 2, twice, 2 types, and 2 or more, twice or more, and 2 types or more types.

All documents mentioned in the application are considered to be included in the application of the disclosure as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

In some cases, the actions or steps described in the claims can be performed in a different order than in the embodiments and still achieve desired results. In addition, the processes depicted in the drawings do not necessarily require the specific order or sequential order shown in order to achieve the desired results. In some embodiments, multitasking and parallel processing are also possible or may be advantageous.

What is claimed is:

1. A data compression method, applied to a memory controller, comprising:
    storing data to be written into a first address and a second address into a data buffer in response to a data write request to the first address and the second address of a memory module from a host; wherein, the first address and the second address are located in the same memory bank of the memory module;
    according to a relationship between the first address and the second address, selecting a compression scheme from pre-configured compression schemes, and attempting to compress the data to be written into the first address and the second address into compressed data that can be stored into either the first address or the second address by using a pre-defined compression method, if the attempt to compress successes, storing the compressed data into the first address or the second address, and identifying the compressed data by using redundant ERROR CORRECTION CODE (ECC) bits to form first identification information.

2. The data compression method of claim 1, wherein the first identification information comprises an identification for indicating that the data is compressed, the relationship between the first address and the second address, and the compression method used.

3. The data compression method of claim 2, wherein the relationship between the first address and the second address comprises: the first address and the second address being located in adjacent rows of the same memory bank, and the first address and the second address being located in non-adjacent rows of the same memory bank.

4. The data compression method of claim 3, wherein, if the first address and the second address are located in non-adjacent rows of the same memory bank, the first identification information further comprises row address information of the first address or the second address where the compressed data is not stored into.

5. The data compression method of claim 1, wherein the pre-configured compression schemes comprise:
    a scheme for compressing data of two adjacent addresses in the same memory bank, and a scheme for compressing data of two non-adjacent addresses in the same memory bank.

6. The data compression method of claim 1, further comprising:
    if the attempt to compress fails, storing the data to be written into the first address and the second address into the first address and the second address, respectively, and identifying the data stored into the first address and the data stored into the second address respectively by using respective redundant ECC bits to form second identification information.

7. The data compression method of claim 6, wherein the second identification information comprises an identification for indicating that data is not compressed.

8. A data decompression method, applied to a memory controller, comprising:
    reading data from a first address or a second address of a memory module in response to a read request for data of the first address or the second address from a host;
    if first identification information is identified according to redundant ERROR CORRECTION CODE (ECC) bit identification in the first address or the second address, decompressing the data read from the first address or the second address according to the first identification information to obtain decompressed data of the first address and the second address;
    storing the decompressed data of the first address and the second address into a data buffer, and returning the data of corresponding address to the host according to the read request from the host.

9. The data decompression method of claim 8, wherein, after storing the decompressed data into the data buffer, the method further comprises:
    in response to the read request for data of the first address or the second address from the host;
    retrieving and sending the data of the first address or the second address from the data buffer to the host.

10. The data decompression method of claim 8, wherein the first identification information comprises an identification for indicating that the data is compressed, a relationship between the first address and the second address, and a compression method used.

11. The data decompression method of claim 10, wherein the relationship between the first address and the second address comprises: the first address and the second address being located in adjacent rows of the same memory bank, and the first address and the second address being located in non-adjacent rows of the same memory bank.

12. The data decompression method of claim 11, wherein, if the first address and the second address are located in non-adjacent rows of the same memory bank, the first identification information further comprises row address information of the first address or the second address where the compressed data is not stored into.

13. The data decompression method of claim 8, wherein, if second identification information is identified according to redundant ECC bit identification in the first address or the second address, returning the data read from the first address or the second address to the host.

14. The data decompression method of claim 13, wherein the second identification information comprises an identification for indicating that data is not compressed.

15. A data compression system comprising a memory module and a memory controller, wherein the memory controller comprises:
   a receiving module, configured to store data to be written into a first address and a second address into a data buffer in response to a data write request to the first address and the second address of the memory module from a host; wherein, the first address and the second address are located in the same memory bank of the memory module;
   a compression processing logic module, configured to select a compression scheme from pre-configured compression schemes according to a relationship between the first address and the second address, and attempt to compress the data to be written into the first address and the second address into compressed data that can be stored into either the first address or the second address by using a pre-defined compression method, if the attempt to compress successes, store the compressed data into the first address or the second address, and identify the compressed data stored into the first address or the second address by using redundant ERROR CORRECTION CODE (ECC) bits to form first identification information.

16. The data compression system of claim 15, wherein the first identification information comprises an identification for indicating that the data is compressed, the relationship between the first address and the second address, and the compression method used.

17. The data compression system of claim 16, wherein the relationship between the first address and the second address comprises: the first address and the second address being located in adjacent rows of the same memory bank, and the first address and the second address being located in non-adjacent rows of the same memory bank.

18. The data compression system of claim 17, wherein, if the first address and the second address are located in non-adjacent rows of the same memory bank, the first identification information further comprises row address information of the first address or the second address where the compressed data is not stored into.

19. The data compression system of claim 15, wherein the pre-configured compression schemes comprise:
   a scheme for compressing data of two adjacent addresses in the same memory bank, and a scheme for compressing data of two non-adjacent addresses in the same memory bank.

20. The data compression system of claim 15, wherein the compression processing logic module is further configured to store the data to be written to the first address and the second address into the first address and the second address respectively if the attempt to compress fails, and identify the data stored into the first address and the data stored into the second address respectively by using respective redundant ECC bits to form second identification information, wherein the second identification information comprises an identification for indicating that data is not compressed.

* * * * *